United States Patent [19]

Takaya

[11] Patent Number: 5,737,043
[45] Date of Patent: Apr. 7, 1998

[54] LIQUID CRYSTAL DISPLAY PANEL HOLDING METAL FIXTURE

[75] Inventor: Kei Takaya, Shizuoka, Japan

[73] Assignee: NEC Corporation, Tokyo, Japan

[21] Appl. No.: 637,472

[22] Filed: Apr. 25, 1996

[30]     Foreign Application Priority Data

Apr. 28, 1995  [JP]  Japan ..................... 7-105391

[51] Int. Cl.⁶ .................. G02F 1/1333; G02F 1/13; H01S 4/00
[52] U.S. Cl. ............. 349/58; 349/187; 29/DIG. 12; 29/592.1
[58] Field of Search ............ 349/58, 187; 29/592.1, 29/458, DIG. 12, DIG. 3

[56]      References Cited

U.S. PATENT DOCUMENTS 4,421,265  12/1983  Boyer et al. ............... 228/180 R

FOREIGN PATENT DOCUMENTS

| 0 503 427 | 9/1992 | European Pat. Off. . |
| 26 17 633 | 11/1977 | Germany . |
| 33 25 360 | 1/1985 | Germany . |
| 42 32 600 | 3/1994 | Germany . |
| 55-120 473 | 9/1980 | Japan . |
| 63-265 496 | 11/1988 | Japan . |
| 5-165 044 | 6/1993 | Japan . |

*Primary Examiner*—Anita Pellman Gross
*Attorney, Agent, or Firm*—Young & Thompson

[57]        ABSTRACT

A liquid crystal display panel holding metal fixture that prohibits the flow of solder through a gap at its corner portion when it is soldered to a printed circuit board. The liquid crystal display panel holding metal fixture has bottom and side surfaces that are formed by bending a metal plate cut into a predetermined shape. The bottom surface has corner portions where the cut surfaces of the metal plate are close to each other. The metal plate is plated to impart solder wettability thereto when the metal plate is made of a material having poor solder wettability, and is thereafter cut into the predetermined shape to expose the poor wettability material at the cut portions that prohibit the flow of solder through the gap. Alternatively, the metal plate is made of a material having good solder wettability, and the cut surfaces are subjected to a surface treatment for reducing solder wettability.

4 Claims, 3 Drawing Sheets

LIQUID CRYSTAL DISPLAY PANEL HOLDING METAL FIXTURE

BACKGROUND OF THE INVENTION

1. Field of the Invention

The present invention relates to a liquid crystal display panel holding metal fixture used in a liquid crystal display apparatus and, more particularly, to a liquid crystal display panel holding metal fixture which holds a liquid crystal display panel and is soldered to a printed circuit board.

2. Description of the Prior Art

FIGS. 1A and 1B are perspective views showing the shape of a conventional liquid crystal display panel holding metal fixture. A bottom surface 2a and side surfaces 2b of a liquid crystal display panel holding metal fixture 1 are formed by bending three sides of a metal plate cut into a predetermined shape in directions indicated by arrows with a pressing machine, as shown in FIG. 1A. AS shown in FIG. 1B, a liquid crystal display panel 2 is held by the completed liquid crystal display panel holding metal fixture 1, and the liquid crystal display panel holding metal fixture 1 is soldered to a printed circuit board 3.

As the liquid crystal display panel holding metal fixture 1 is formed by bending a metal plate in this manner, at a corner portion 10 in FIG. 1B of the bottom surface of the liquid crystal display panel holding metal fixture 1 which is encircled by a broken line, cut surfaces 1a and 1b of the metal plate that forms the side surfaces 2b are close to each other.

As materials for the conventional liquid crystal display panel holding metal fixture 1, a metal plate (e.g. a copper plate) made of a material having good solderability, or a plate obtained by performing plating (e.g., silver plating, nickel plating, or the like) on an entire metal plate (e.g., a stainless steel plate, an aluminum plate, or the like) to provide good solderability is used, so that the liquid crystal display panel holding metal fixture 1 can be easily soldered to the printed circuit board 3.

A process of performing silver plating on a stainless steel plate, which is used for fabricating the liquid crystal display panel holding metal fixture 1, will be described with reference to FIG. 2.

First, the stainless steel plate is cut into a predetermined shapes shown in FIG. 1A (201). A pre-treatment such as cleaning (202) and primary nickel plating (203) are performed. Subsequently, copper strike plating (204), copper plating (205), silver strike plating (206), and silver plating (207) are performed sequentially, thus completing plating. The plated stainless steel plate is bent by a pressing machine to form the liquid crystal display panel holding metal fixture 1.

In this manner, the conventional liquid crystal display panel holding metal fixture 1 is fabricated by using a metal plate made of a material having good solderability or a metal plate entirely plated with silver or the like provide with good solderability. Hence, the cut surfaces 1a and 1b of the neighboring side surfaces of the corner portion 10 of the liquid crystal display panel holding metal fixture 1 are accordingly made of a material having good solderability, or have been plated to provide good solderability.

A soldering pattern (not shown) is formed on a portion of the printed circuit board 3 which corresponds to the corner portion 10 of the liquid crystal display panel holding metal fixture 1, and the corner portion 10 is fixed to this pattern with solder. Therefore, when the liquid crystal display panel holding metal fixture 1 is soldered to the printed circuit board 3, solder flows into the liquid crystal display panel holding metal fixture 1 through the gap between the cut surfaces 1a and 1b of the close side surfaces of the corner portion 10 of the liquid crystal display panel holding metal fixture 1, As indicated by the sectional view of the liquid crystal display panel holding metal fixture 1 of FIG. 3, solder 5 (a black solid portion in FIG. 3) that has flowed into the corner portion 10 enters a portion between the liquid crystal display panel 2 and the inner bottom surface of the liquid crystal display panel holding metal fixture 1. Then, the liquid crystal display panel 2 is held in an inclined state.

SUMMARY OF THE INVENTION

It is an object of the present invention to provide a liquid crystal display panel holding metal fixture in which solder can be prohibited from flowing through the gap of its corner portion when it is to be soldered to a printed circuit board, so that a liquid crystal display panel can be prevented from being held in an inclined state due to the solder that has flowed into the liquid crystal display panel holding metal fixture.

In order to achieve the above object, according to an aspect of the present invention, there is provided a liquid crystal display panel holding metal fixture which holds a liquid crystal display panel and which is to be soldered to a printed circuit board, the liquid crystal display panel holding metal fixture having bottom and side surfaces that are formed by bending a metal plate cut into a predetermined shape, the bottom surface having a corner portion where cut surfaces of the metal plate that form the side surfaces are close to each other, wherein the metal plate is obtained by performing plating for imparting solder wettability on a metal plate made of a material having poor solder wettability, and cutting the plated metal plate into the predetermined shape, and the material having poor solder wettability is exposed to the cut surfaces.

According to another aspect of the present invention, there is provided a liquid crystal display panel holding metal fixture which holds a liquid crystal display panel and which is to be soldered to a printed circuit board, the liquid crystal display panel holding metal fixture having bottom and side surfaces that are formed by bending a metal plate cut into a predetermined shape, the bottom surface having a corner portion where cut surfaces of the metal plate that form the side surfaces are close to each other, wherein the metal plate is made of a material having good solder wettability, and the cut surfaces are subjected to a surface treatment for hampering solder wettability.

When the above arrangement is employed, in the liquid crystal display panel holding metal fixture according to the present invention, solder does not easily wet the cut surfaces of the metal plate that form adjacent side surfaces at the corner portion of the bottom surface of the liquid crystal display panel holding metal fixture. Thus, the solder can be prohibited from flowing into the liquid crystal display panel holding metal fixture through the gap between the adjacent cut surfaces when the liquid crystal display panel holding metal fixture is soldered to the printed circuit board. Accordingly, the liquid crystal display panel can be prevented from being held in an inclined state due to the solder that has flowed into the liquid crystal display panel holding metal fixture, A method of manufacturing a liquid crystal display panel holding metal fixture according to the present invention comprises performing plating for imparting solder wettability on a metal plate made of a material having poor solder wettability, cutting the plated metal plate into a predetermined shape, and forming bottom and side surfaces by bending predetermined sides of the cut metal plate.

When the above manufacturing method is employed, a liquid crystal display panel holding metal fixture in which a liquid crystal display panel can be prevented from being held in an inclined state due to solder that has flowed into it can be manufactured with the same number of steps as that of a conventional manufacturing method.

DETAILED DESCRIPTION OF PREFERRED EMBODIMENT

The present invention will be described with reference to the accompanying drawings.

Figure 4:
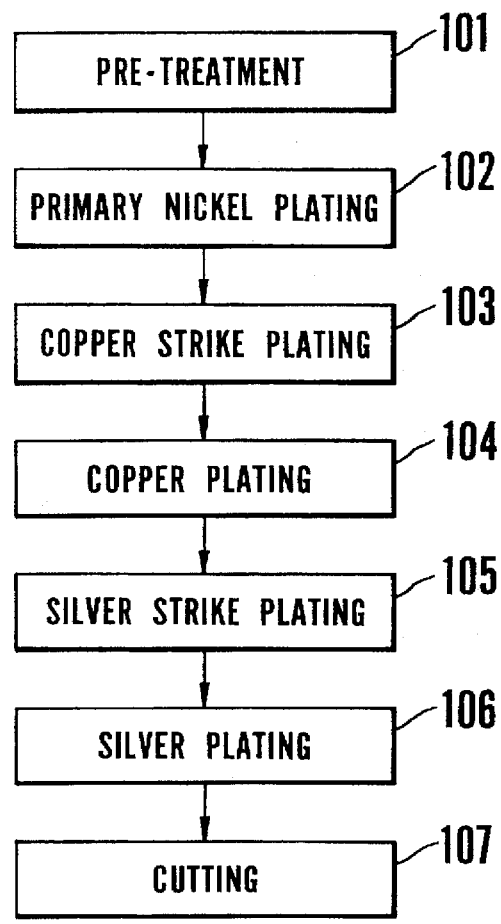
FIG. 4 is a process view showing the steps of performing silver plating on a stainless steel plate used for fabricating a liquid crystal display panel holding metal fixture according to the present invention.
Figure 5:
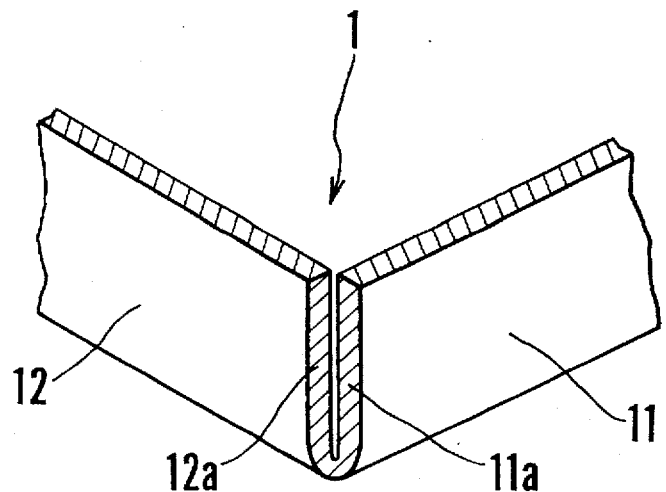
FIG. 5 is an enlarged perspective view of the corner portion of the liquid crystal display panel holding metal fixture according to the present invention.

FIG. 4 is a process view showing the steps of performing silver plating on a stainless steel plate used for fabricating a liquid crystal display panel holding metal fixture according to the present invention, and FIG. 5 is a perspective view of the corner portion of the liquid crystal display panel holding metal fixture according to the present invention.

A liquid crystal display panel holding metal fixture 1 is fabricated by using a plate obtained by performing plating with a metal having good solderability, e.g., silver plating, on a metal plate made of a material having poor solder wettability, e.g., a stainless steel plate. The steps of performing silver plating on the stainless steel plate in order to fabricate the liquid crystal display panel holding metal fixture 1 will be described with reference to FIG. 4.

Figure 1A:
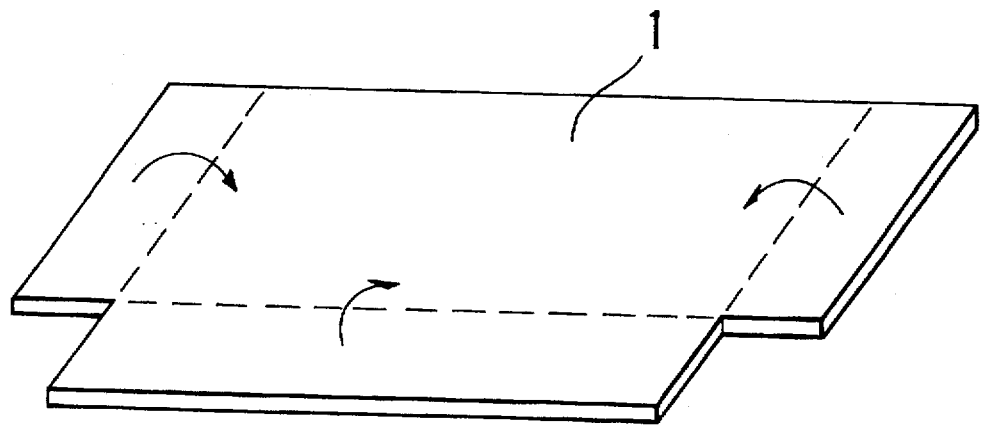
FIG. 1A is a perspective view showing a conventional liquid crystal display panel holding metal fixture before it is assembled.
Figure 1B:
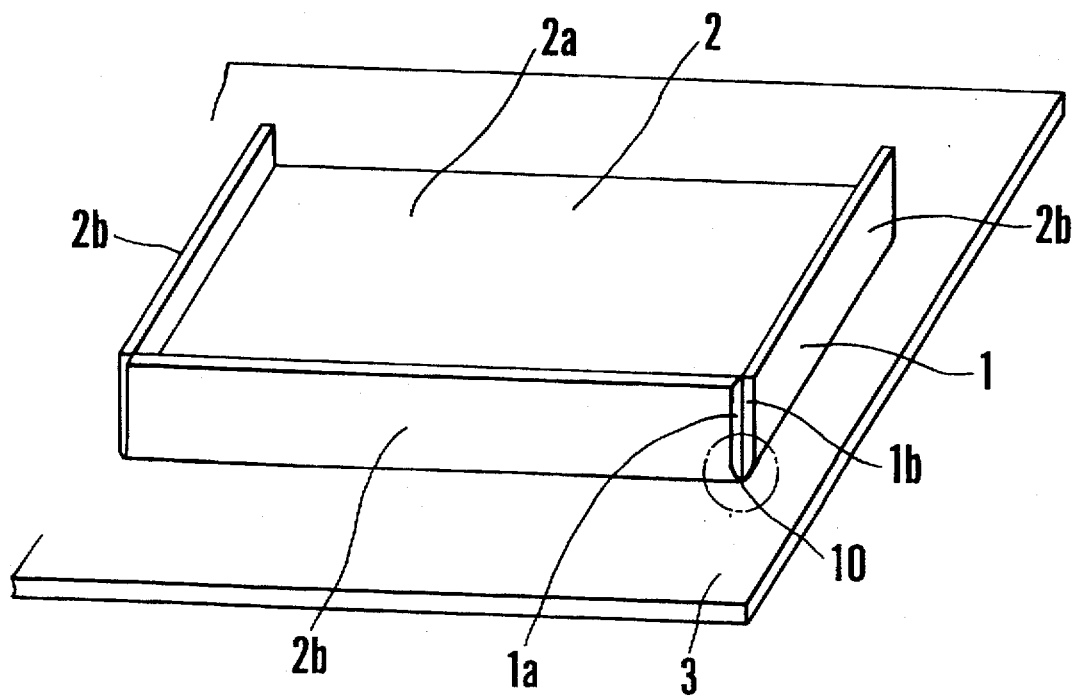
FIG. 1B is a perspective view showing the same after it is assembled.
Figure 2:
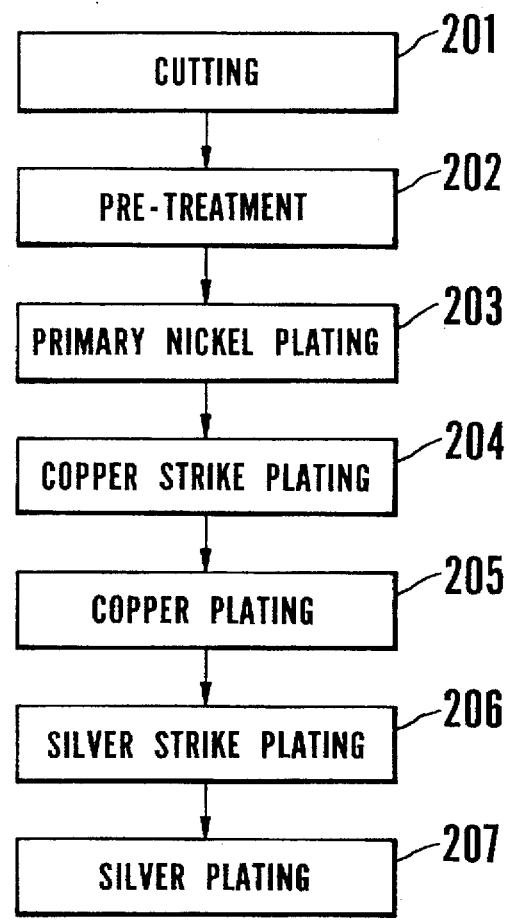
FIG. 2 is a process view showing the steps of performing silver plating on a stainless steel plate used for fabricating a liquid crystal display panel holding metal fixture.
Figure 3:
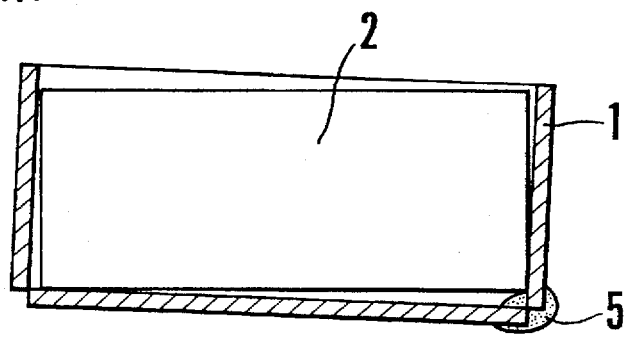
FIG. 3 is a sectional view of the conventional liquid crystal display panel holding metal fixture.

The stainless steel plate is subjected to a pre-treatment such as cleaning (101). Then, primary nickel plating (102), copper strike plating (103), copper plating (104), silver strike plating (105), and silver plating (106) are performed sequentially. Finally, the stainless steel plate is cut into a shape as shown in FIG. 1A (107). Thereafter, the cut stainless steel plate is bent by a pressing machine to fabricate a holding metal fixture having a shape similar to that of the conventional holding metal fixture shown in FIG. 1B.

As shown in FIG. 5, at the corner portion of the liquid crystal display panel holding metal fixture 1, cut surfaces 11a and 12a (hatched portions) of stainless steel plates 11 and 12 that form adjacent side surfaces are close to each other. As the stainless steel plate is cut after it is subjected to silver plating, as shown in FIG. 4, stainless steel is exposed to the cut surfaces 11a and 12a. Other portions of the stainless steel plate are plated with silver.

when this liquid crystal display panel holding metal fixture 1 is to be soldered to the printed circuit board, the cut surfaces 11a and 12a from which stainless steel is exposed are close to each other at the corner portion of the liquid crystal display panel holding metal fixture 1. Since solder does not easily wet the cut surfaces 11a and 12a, it can be prevented from flowing into the liquid crystal display panel holding metal fixture 1 through the gap of the corner portion. As portions of the corner portion of the liquid crystal display panel holding metal fixture i other than the cut surfaces 11a and 12a are plated with silver, the liquid crystal display panel holding metal fixture 1 can be soldered to the printed circuit board easily.

According to another embodiment, a metal plate (e.g., a copper plate) having good solder wettability is used. This metal plate is cut into a predetermined shape to form a liquid crystal display panel holding metal fixture. Thereafter, a surface treatment for hampering solder wettability is performed on the out surfaces of the adjacent metal plates of the corner portion of the liquid crystal display panel holding metal fixture. As the surface treatment, for example, the cut surfaces of the adjacent metal plates are coated with a material (e.g., enamel) having poor solder wettability. This prohibits the solder from flowing into the liquid crystal display panel holding metal fixture through the gap in the corner portion of the liquid crystal display panel holding metal fixture, while the liquid crystal display panel holding metal fixture itself can be soldered to the printed circuit board easily. The same effect can be obtained even if a liquid crystal display panel holding metal fixture is formed by cutting a metal plate having good solder wettability into a predetermined shape, then performing a surface treatment for hampering solder wettability for the cut surfaces, and bending predetermined sides of the metal plate.

What we claim is:

1. A liquid crystal display panel holding metal fixture which is for holding a liquid crystal display panel and which is to be soldered to a printed circuit board, said liquid crystal display panel holding metal fixture having bottom and side surfaces that are formed by bending a metal plate cut into a predetermined shape, said bottom surface having a corner portion where cut surfaces of said metal plate that form said side surfaces are close to each other, wherein said metal plate comprising a material having poor solder wettability and plating thereon for imparting solder wettability to said metal plate, and wherein the material having poor solder wettability is exposed at said cut surfaces.

2. A liquid crystal display panel holding metal fixture according to claim 1, wherein said metal plate comprises a stainless steel plate with silver plating thereon.

3. A method of manufacturing a liquid crystal display panel holding metal fixture, comprising the steps of:

plating a metal plate made of a material having poor solder wettability to impart solder wettability thereto;

cutting said plated metal plate into a predetermined shape; and forming bottom and side surfaces by bending predetermined sides of said cut metal plate.

4. A liquid crystal display panel holding metal fixture which holds a liquid crystal display panel and which is to be soldered to a printed circuit board, said liquid crystal display panel holding metal fixture having bottom and side surfaces that are formed by bending a metal plate cut into a predetermined shape, said bottom surface having a corner portion where cut surfaces of said metal plate that form said side surfaces are close to each other, wherein said metal plate is made of a material having good solder wettability, and said cut surfaces are subjected to surface treatment for hampering solder wettability.

\* \* \* \* \*